United States Patent [19]

Bohnhoff

[11] 4,121,060
[45] Oct. 17, 1978

[54] TOUCH BUTTON SWITCH FOR DICTATION HANDSET

[75] Inventor: Alan Earl Bohnhoff, Loxley, Ala.

[73] Assignee: Lanier Business Products, Inc., Atlanta, Ga.

[21] Appl. No.: 782,894

[22] Filed: Mar. 30, 1977

[51] Int. Cl.² .............................................. G11B 19/16
[52] U.S. Cl. ........................................... 179/100.1 DR
[58] Field of Search ......... 179/100.1 DR, 6 E, 1 SW, 179/2 A

[56] References Cited

U.S. PATENT DOCUMENTS

| | | | |
|---|---|---|---|
| 3,555,202 | 1/1971 | Warnke | 179/100.1 DR |
| 3,636,271 | 1/1972 | Rodenbeck | 179/100.1 DR |
| 3,712,961 | 1/1973 | Nye | 179/100.1 DR |

FOREIGN PATENT DOCUMENTS 1,282,089  11/1968  Fed. Rep. of Germany  179/100.1 DR

Primary Examiner—Raymond F. Cardillo, Jr.
Attorney, Agent, or Firm—Jones, Thomas & Askew

[57] ABSTRACT

A handset for use in connection with a dictate station in a dictation system. The handset has a plurality of control switches which are operable to initiate control functions in the dictation recorder merely by touching the control buttons and without the need for exerting any pressure on the buttons. In this manner, a dictation recorder may be operated in the record, playback or reverse modes of operation merely by touching the control buttons on the handset. The contact made by the operator of the dictate station with the control buttons completes an electrical circuit which, as a result of the body resistance of the operator, alters the voltage levels within the electrical circuit. The altered voltages are compared with reference voltages to provide a control output when the comparison indicates that the voltage level in the electrical circuit has been altered by the interposition of the body resistance of the operator into the circuit.

5 Claims, 4 Drawing Figures

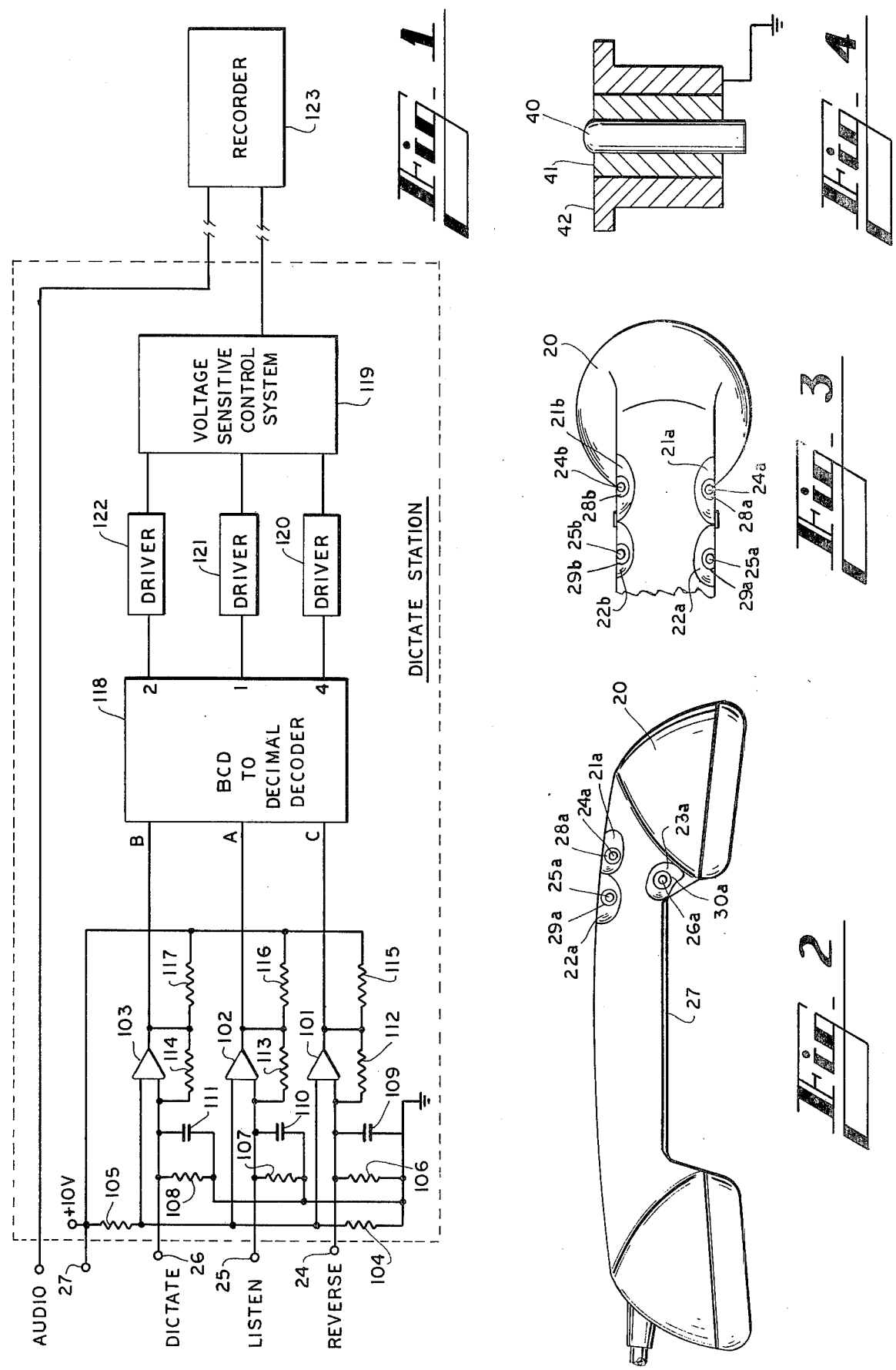

TOUCH BUTTON SWITCH FOR DICTATION HANDSET

BACKGROUND OF THE INVENTION

The present invention relates to dictation systems comprising a dictation recorder and a dictate station, and more particularly to control switch mechanisms for providing control outputs at the dictate station to control the dictation recorder.

Generally, modern dictation systems include a dictation recorder and at least one dictate station. The dictate stations are often located remotely from the dictation recorder. Therefore, each dictate station in the dictation system must be provided a set of controls with which to control the operation of the dictation recorder while the operator at the dictate station is recording.

The initiation of control inputs at the dictate station have generally been accomplished by the operation of mechanical switches. The mechanical switches tend to fatigue the operator during the dictation of lengthy material since they often require the constant application of pressure to keep the switch closed. Additionally, the mechanical switches may be expensive, add increased weight to the handset and be prone to malfunction as a reult of excessive wear or the presence of foreign materials, such as dust or dirt, in the switch.

SUMMARY OF THE INVENTION

The present invention replaces the mechanical control switches of the prior art dictate stations with electrical contact switches on the handset. Thus, it is one object of the present invention to provide a control switching circuit which does not include mechanical switches, but is electrically responsive to the touch of the operator at the dictate station.

It is another object of the present invention to provide a control switch apparatus which does not fatigue the operator over extended periods of operation.

It is a further object of the present invention to provide a control switch apparatus which is small in size and weight.

It is still another object of the present invention to provide a control switch apparatus which is not prone to malfunction because of either excessive wear or the presence of foreign materials, such as dust or dirt, in the switch apparatus.

These and other objects and advantages of the present invention will be more readily understood by reference to the following detailed description of a preferred embodiment of the invention and the accompanying drawings.

BRIEF DESCRIPTION OF THE DRAWINGS

FIG. 1 is a schematic diagram of a preferred embodiment of the touch button control switch apparatus;

FIG. 2 is a side view of a handset incorporating a first alternative embodiment of the touch button control switch apparatus;

FIG. 3 is a top view of a handset incorporating the first alternative embodiment of the touch button control switch apparatus; and FIG. 4 is a section view of a touch button described in connection with a second alternative embodiment of the touch button control switch apparatus.

DETAILED DESCRIPTION OF PREFERRED EMBODIMENTS

The alternative embodiments of the present invention use a variety of touch-sensitive control buttons. In general, the touch-sensitive control buttons are constructed of two separate contact surfaces which are separated from each other by an insulative material. Each of the contact surfaces is electrically connected to an electrical control circuit, a preferred embodiment of which will be described more fully below. The touch-sensitive control buttons are operated by the electrical connection of a conductor having a limited internal resistance between the two contact surfaces of the touch-sensitive control button. In this manner the touch-sensitive control button may be operated by the touching of the two contact surfaces by an operator. The body of the operator acts as a conductor having a limited internal resistance and it provides an electrical connection between the two contact surfaces of the touch-sensitive control button.

Referring first to the alternative types of touch-sensitive control buttons and the alternative methods of mounting the touch-sensitive control buttons on the handset, FIGS. 2 and 3 show side and top views of a handset 20 for a dictate station. A plurality of indentations 21a, 21b, 22a, 22b, 23a and 23b are shown in FIGS. 2 and 3. Centrally located in each of the indentations is one of the contact surfaces 24a, 24b, 25a, 25b, 26a and 26b, respectively. The contact surfaces are each surrounded by a collar or sleeve of insulative material 28a, 28b, 29a, 29b, 30a and 30b, respectively. As will be more fully described below, a second contact surface 27 may provide a common second contact surface for all of the touch-sensitive control buttons 24a, 24b, 25a, 25b, 26a and 26b. The function of each of these touch-sensitive control buttons will be described more fully below.

Referring now to FIG. 4, an alternative embodiment of the touch-sensitive control buttons is shown. In the alternative embodiment of the touch-sensitive control button, each of the touch-sensitive control buttons has a separate second contact surface and no common second contact surface is provided. Thus, each touch-sensitive control button has a central core 40 made from a conductive material surrounded by a sleeve 41 of insulative material. The central core conductor 40 provides the first contact surface for the touch-sensitive control button. Surrounding the insulating sleeve 41 is a second sleeve 42 which is made of a conductive material and which provides the second contact surface for the touch-sensitive control button.

With reference to FIG. 2, the touch-sensitive control buttons, whether of the design shown in FIG. 2 or of the design shown in FIG. 4, which are located in the indentations 21a and 21b are the touch-sensitive control buttons which provide a reverse control signal to the dictation recorder 120. The touch-sensitive control buttons located in the indentations 25a and 25b are the touch-sensitive control buttons which cause a listen control output to be provided to the recorder 120. The touch-sensitive control buttons located in indentation 23a and 23b (not shown) are the touch-sensitive control buttons which provide a record or dictate control output to the dictation recorder 120. It will be understood by those skilled in the art that the operator of a dictate system at a remote dictate station may be provided with the capability for controlling a plurality of functions other than those described above. The present invention is not limited to control of the normal functions, but may be used to provide a control output from a dictate station for all of the many functions and capabilities of a modern dictation system. These functions and capabilities include, but are not limited to, intercom functions and the recording of instruction marks and end of dictation marks.

The touch-sensitive control buttons located in each of the indentations are electrically connected in parallel so that the operation of either of the touch-sensitive control buttons associated with a particular function control output will cause the desired control output. Therefore, with reference to the touch-sensitive control button inputs 24, 25 and 26 shown in the schematic diagram of FIG. 1, the inputs from the first contact surfaces of the touch-sensitive control buttons 24a, 24b, 25a, 25b, 26a and 26b related to each particular function will be simply represented as inputs 24, 25 and 26. Additionally, the second contact surfaces will all show a common voltage level and therefore will be represented as the common contact surface 27 in the schematic drawing shown in FIG. 1, even though there may actually be a physical plurality of such common contact surfaces 41 each associated with a single touch sensitive control button as described above. However, it will be understood that the operation of either of the touch-sensitive control buttons related to a particular function will provide the input associated with that function in the schematic drawing of FIG. 1.

Referring now to FIG. 1, the first contact surface 24 provides a reverse control input. The first contact surface 25 provides a listen control input. The first contact surface 26 provides a dictate control input. The common second contact surface for the touch sensitive control buttons shown in the first embodiment provides an input 27. As may be seen from FIG. 1, an open circuit exists between each of the first contact surfaces 24, 25, and 26 and the second contact surface 27. The voltage at the second contact surface in this preferred embodiment is the higher voltage provided by the power supply at the dictate station (not shown). The first control surfaces 24, 25 and 26 are shown as being connected to a ground state through the resistors 106, 107 and 108, respectively.

A voltage divider circuit consisting of the resistors 104 and 105 is also shown in FIG. 1. The resistors 104 and 105 are connected in series across the voltage of the power supply in the dictate station. As will be understood by those skilled in the art, the voltage on the line between the resistances 104 and 105 will be proportional to the voltage of the power supply in a ratio dictated by the respective values of the resistances 104 and 105.

The voltage in the voltage divider circuit between the resistances 104 and 105 provides a reference voltage for a comparison circuit. Thus, the voltage in the voltage divider circuit between the resistors 104 and 105 provides reference voltage for the analog voltage comparators 101, 102 and 103. As will be understood by those skilled in the art, an analog voltage comparator compares a reference voltage with an input voltage and depending upon the result of the comparison provides either a high or a low digital output. The high or low digital output corresponds to a logical one or logical zero.

The analog voltage comparators 101, 102 and 103 also have inputs from each of the handset control inputs 24, 25 and 26. Thus, the analog voltage comparator 101 has an input voltage from the handset input 24. The analog voltage comparator 102 has an input voltage from the handset control input 25. The analog voltage comparator 103 has an input voltage from the handset control input 26.

As has been described above, the control inputs 24, 25 and 26 are connected in series with the resistors 106, 107 and 108, respectively. As will be more fully described below, the resistors 106, 107 and 108 will also have a voltage divider effect when the respective control inputs 24, 25 and 26 are individually connected with the second contact surface 27. As will also be more fully described below, the contact between the first contact surfaces 24, 25 and 26 and the second contact surface 27 will cause the handset input voltages at the analog voltage comparators 101, 102 and 103 to go above the reference voltage set by the voltage divider of resistors 104 and 105. Thus, when any one of the handset control inputs 24, 25 or 26 experiences a sufficient change in voltage, the appropriate analog voltage comparator 101, 102 or 103 will provide a logical one control input.

Before the respective analog voltage comparators 101, 102 or 103 have gone from the zero state to the logical one state, the resistors 115, 116, 117, respectively, provide a return electrical path to the power supply potential for the relatively low voltage comparator outputs. The resistors 112, 113 and 114, respectively, provide a means for maintaining the low voltage level at the inputs to the analog voltage comparators 101, 102 and 103. Thus, the analog voltage comparators 101, 102 and 103 are prevented from unintentionally going from the logical zero to the logical one state.

As will also be understood by those skilled in the art, the operation of an analog voltage comparator introduces a current drain on the inputs to the analog voltage comparator. Resistors 112, 113 and 114 are provided to supplement the current flow from the handset voltage inputs 24, 25 and 26 once the respective analog voltage comparator 101, 102 or 103 has gone from a logical zero to a logical one output. The resistors 112, 113 and 114 thereby increase the hysterisis characteristics of the analog voltage comparators 101, 102 and 103 after the output from the respective analog voltage comparators has gone to the logical one condition.

Additionally, capacitors 109, 110 and 111 are provided in parallel with resistors 106, 107 and 108, respectively. The purpose for the capacitors 109, 110 and 111 is to filter noise components from the handset input voltages 24, 25 and 26, respectively.

The digital outputs from analog voltage comparators 101, 102 and 103 provide inputs to a binary coded decimal-to-decimal decoder 118. The BCD to decimal decoder 118 provides a control output to a dictate station voltage sensitive control system 119 through a plurality of drivers 120, 121 and 122. The BCD to decimal decoder 118 performs the function of preventing the simultaneous transmission of conflicting control outputs to the voltage-sensitive control system 119 to be described below. This result is achieved by connecting only those outputs of the BCD to decimal decoder which are responsive to the presence of a digital input having a single "one" in the binary input e.g., 0001, 0010, 0100, 1000, to the voltage-sensitive control system. Thus, the presence of more than a single one in the binary input from the analog comparators 101, 102 and 103 will cause the BCD to decimal decoder 110 to provide an output which is not connected to the voltage-sensitive control system 119. Therefore, the voltage sensitive control system 119 will not be enabled to cause the transmission of conflicting control outputs to the recorder 120.

As stated above, the purpose of the decoder 118 is to prevent the simultaneous provision of more than one digital comparator output. Therefore, it will be understood by those skilled in the art that any means for accomplishing this object may be substituted for the decoder 118. Such substitute devices include, but are not limited to, other digital decoders having more or less than ten outputs or digital decoders such as grey decoders.

The voltage-sensitive control system 119 may be of the type shown in U.S. Pat. No. 3,569,741, assigned to Lanier Electronic Laboratory, Inc., which is incorporated herein by reference. Once the correct input is received, the voltage sensitive control system 119 causes the appropriate controls in the recorder 120 to be operated to place the recorder in the dictate, forward or reverse mode of operation.

It will now be understood by those skilled in the art that the alternative embodiments of the present invention which have been disclosed above fulfill the objects of the invention by providing a control switch apparatus for use in a dictate station which may be operated by a dictate station operator merely by making contact with the switch apparatus and without the need to continuously exert pressure. Moreover, the switch apparatus described in the alternative embodiments is small in size and weight and is not as subject to the wear or to the presence of dust and dirt as mechanical switches. It will be understood that obvious modifications may be made to the disclosed alternative embodiments without departing from the scope of the present invention. The scope of the present invention is limited solely by reference to the appended claims.

What is claimed is:

1. A dictation system including a dictation recorder having first and second modes of operation and a dictate station from which said first and second modes of operation of said dictation recorder may be controlled by an operator, wherein the improvement comprises a control switch apparatus for use in said dictate station by said operator for controlling said first and second modes of operation of said dictation recorder from said dictate station, comprising:
   a first input voltage means for providing a first input voltage in response to the electrical contact of said first input voltage means with said operator;
   said first input voltage means including a first contact surface having a first voltage,
   a second contact surface separated from said first contact surface by an insulating material and having a second voltage, and
   a means for changing the voltage of at least one of said first and second contact surfaces to said first input voltage in response to the electrical interposition of said operator between said first contact surface and said second contact surface;
   a second input voltage means for providing a second input voltage in response to the electrical contact of said second input voltage means with said operator; said second input voltage means including
   a third contact surface having a third voltage,
   a fourth contact surface separated from said third contact surface by an insulating material and having a fourth voltage; and
   a means for changing the voltage of at least one of said third and fourth contact surfaces to said second input voltage in response to the electrical interposition of said operator between said third contact surface and said fourth contact surface;
   a reference voltage means for providing a first reference voltage and a second reference voltage;
   a first analog voltage comparison means for comparing said first input voltage with said first reference voltage and for providing a first digital output in response to said first input voltage and said first reference voltage being in a predetermined relationship;
   a second analog voltage comparison means for comparing said second input voltage with said second reference voltage and for providing a second digital output in response to said second input voltage and said second reference voltage being in a predetermined relationship;
   a control signal means:
      for providing said first digital output from said first analog voltage comparison means to said dictation recorder as a first control signal to cause said dictation recorder to be operated in said first mode of operation;
      for providing said second digital output from said second analog voltage comparison means to said dictation recorder as a second control signal to cause said dictation recorder to be operated in said second mode of operation; and
      for preventing said first control output and said second control output from being provided to said dictation recorder simultaneously in response to the simultaneous input of said first digital output from said first analog voltage comparison means and of said second digital output from said second analog voltage comparison means.

2. A dictation system as recited in claim 1, wherein said control signal means includes a decoder wherein:
   a first control output is provided to cause said dictation recorder to be placed in said first mode of operation in response to the input of said first digital output from said first analog voltage comparison means without the simultaneous input of said second digital output from said second analog voltage comparison means;
   a second control output is provided to cause said dictation recorder to be placed in said second mode of operation in response to the input of said second digital output from said second analog voltage comparison means without the simultaneous input of said first digital output from said first analog voltage comparison means; and
   no control output is provided to the recorder in response to the simultaneous presence of said first digital output from said first analog voltage comparison means and said second digital output from said second analog voltage comparison means.

3. A dictation system as recited in claim 1 wherein said first reference voltage provided by said reference voltage means is equal to said second reference voltage provided by said voltage reference means.

4. A dictation system including a dictation recorder having first and second modes of operation and a dictate station from which said first and second modes of operation of said dictation recorder may be controlled by an operator, wherein the improvement comprises a control switch apparatus for use in said dictate station by said operator recording dictation from said dictate station, for controlling said first and second modes of operation of said dictation recorder from said dictate station, comprising:

a first input voltage means for providing a first input voltage in response to the electrical contact of said first input voltage means with said operator, including a first contact surface having a first voltage, a second contact surface separated from said first contact surface by an insulating material and having a second voltage, and a means for changing the voltage of at least one of said contact surfaces to said first input voltage in response to the electrical interposition of said operator between said first contact surface and said second contact surface;

a second input voltage means for providing a second input voltage in response to the electrical contact of said second input voltage providing means with said operator, comprising a third contact surface having said first voltage, a fourth contact surface separated from said third contact surface by an insulating material and having said second voltage, and a means for changing the voltage of at least one of said contact surfaces to said second input voltage in response to the electrical interposition of said operator between said third contact surface and said fourth contact surface;

a first reference voltage means for providing a first reference voltage;

a second reference voltage means for providing a second reference voltage;

a first analog voltage comparison means for comparing said first input voltage with said first reference voltage and for providing a first digital output in response to said first input voltage and said first reference voltage being in a predetermined relationship;

a second analog voltage comparison means for comparing said second input voltage with said second reference voltage and for providing a second digital output in response to said second input voltage and said second reference voltage being in a predetermined relationship;

a control signal means;

for providing said first digital output from said first analog voltage comparison means to said dictation recorder as a first control signal to cause said dictation recorder to be operated in said first mode of operation;

for providing said second digital output from said second analog voltage comparison means to said dictation recorder as a second control signal to cause said dictation recorder to be operated in said second mode of operation; and for preventing said first control output and said second control output from being provided to said dictation recorder simultaneously in response to the simultaneous input of said first digital output from said first analog voltage comparison means and of said second digital output from said second analog voltage comparison means.

5. A dictation system including a dictation recorder having a first mode of operation and a second mode of operation, a dictate station from which said dictation recorder can be controlled by an operator, wherein the improvement is a control system comprising:

first input switch means having a first contact surface and a second contact surface electrically isolated from said first contact surface for providing a first input voltage in response to the electrical interposition of said operator between said first contact surface and said contact surface;

second input switch means having a third contact surface and a fourth contact surface electrically isolated from said third contact surface for providing a second input voltage in response to the electrical interposition of said operator between said third contact surface and said fourth contact surface;

first comparator means for providing a first digital signal in response to said first input voltage;

second comparator means for providing a second digital signal in response to said second input voltage;

decoder driver means operatively interconnected with said first comparator means and said second comparator means and said dictation recorder for placing said dictation recorder in said first mode of operation in response to said first digital signal, placing said dictation recorder in said second mode of operation in response to said second digital signal, and rendering said dictation recorder inoperative in response to the concurrent presence of said first digital signal and said second digital signal.

* * * * *